United States Patent
Babini

(10) Patent No.: US 6,547,082 B1
(45) Date of Patent: Apr. 15, 2003

(54) SUPPORT DEVICE FOR BOARDS, IN PARTICULAR FOR PRINTED CIRCUIT BOARDS

(75) Inventor: Ezio Babini, Zola Predosa (IT)

(73) Assignee: Richco Italia S.r.l., Bologna (IT)

( * ) Notice: Subject to any disclaimer, the term of this patent is extended or adjusted under 35 U.S.C. 154(b) by 0 days.

(21) Appl. No.: 10/030,934
(22) PCT Filed: Jul. 7, 2000
(86) PCT No.: PCT/IB00/00925
§ 371 (c)(1),
(2), (4) Date: Apr. 4, 2002
(87) PCT Pub. No.: WO01/06820
PCT Pub. Date: Jan. 25, 2001

(30) Foreign Application Priority Data

Jul. 16, 1999 (EP) .............................................. 99114115

(51) Int. Cl.[7] .............................................. A47G 19/08
(52) U.S. Cl. .................................................... 211/41.17
(58) Field of Search ............................ 211/41.17, 41.1, 211/41.11, 41.12, 41.13, 41.18, 26.2; 361/801

(56) References Cited

U.S. PATENT DOCUMENTS

| 5,533,631 A | 7/1996 | Marchetti | |
|---|---|---|---|
| 6,181,565 B1 * | 1/2001 | Schmitt et al. | 361/756 |
| 6,208,514 B1 * | 3/2001 | Stark et al. | 361/704 |

FOREIGN PATENT DOCUMENTS

| DE | 195 33 063 | 2/1997 |
|---|---|---|
| FR | 1594979 | 7/1970 |

* cited by examiner

Primary Examiner—Alvin Chin-Shue
Assistant Examiner—Sarah Purol
(74) Attorney, Agent, or Firm—William J. Sapone; Coleman Sudol Sapone, P.C.

(57) ABSTRACT

In a support device for printed circuit broads with a support structure, equipped with at least one board guiding groove, a locking group has the task of locking detachably the boards. The support structure has at least one transversal cutting which crosses the groove and cooperates with the locking group. The locking group includes a guiding element which slides inside a relative guiding seat. One end of the guiding element is connected to a plate provided with at least one locking element which is introduced inside the transversal cutting for locking the board.

18 Claims, 5 Drawing Sheets

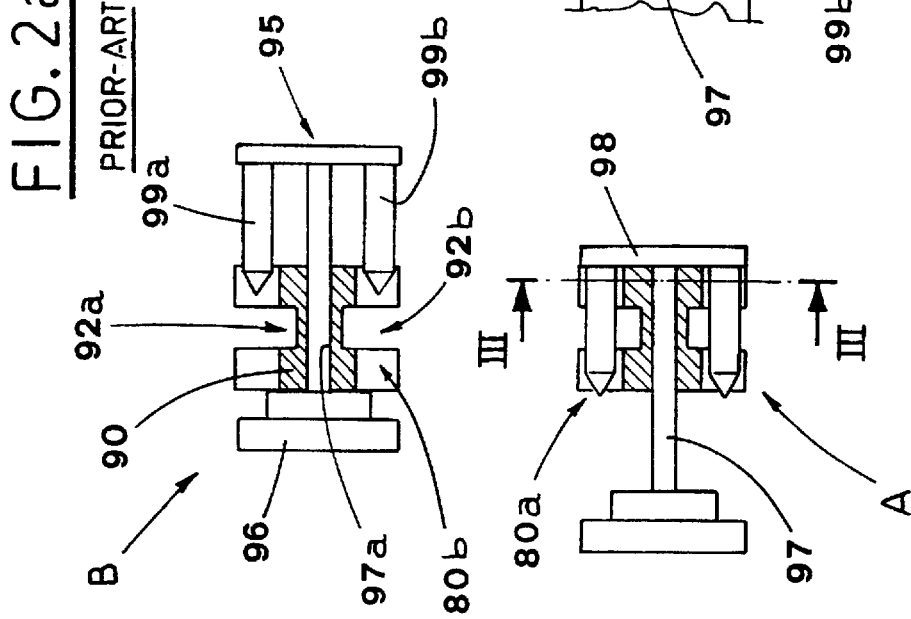
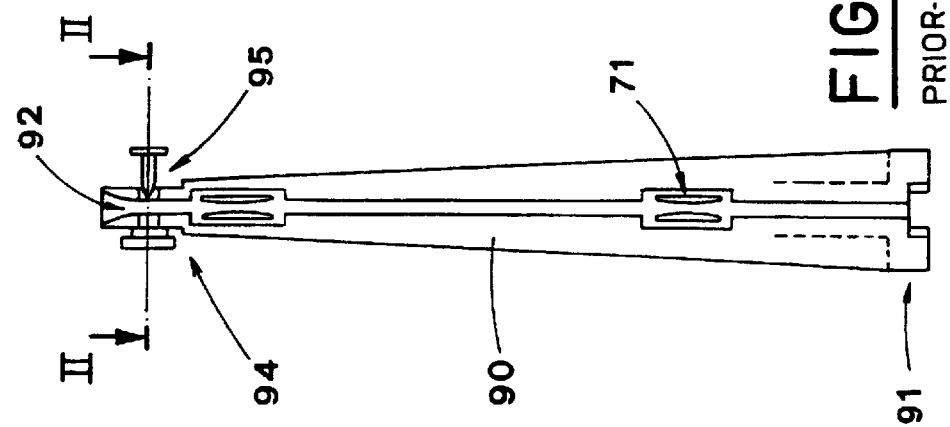

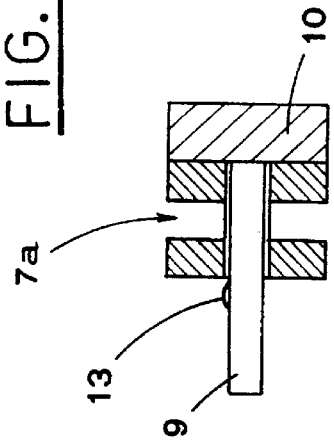
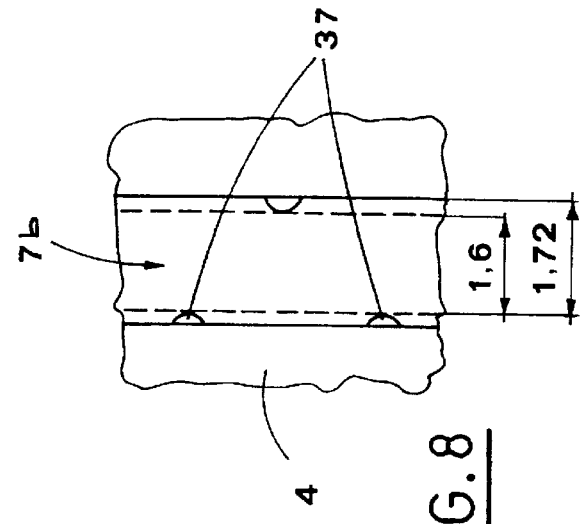
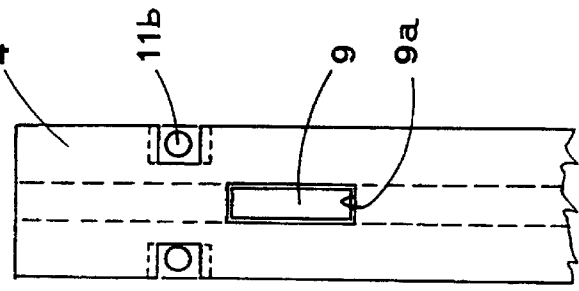
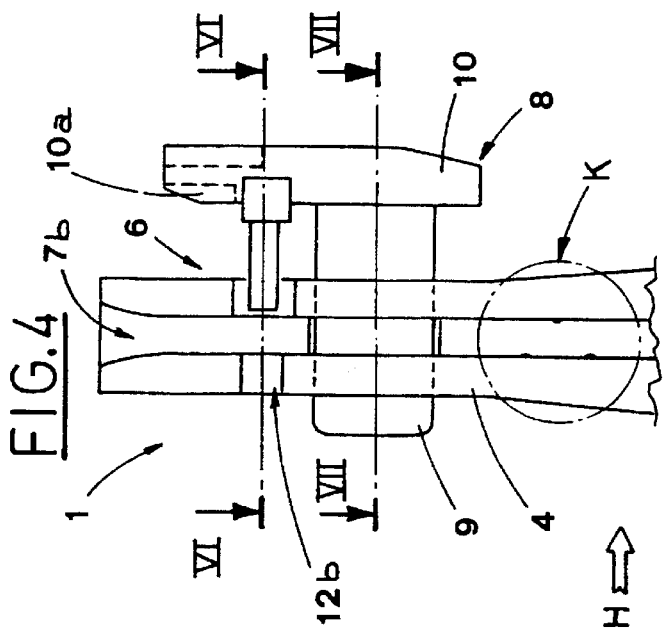
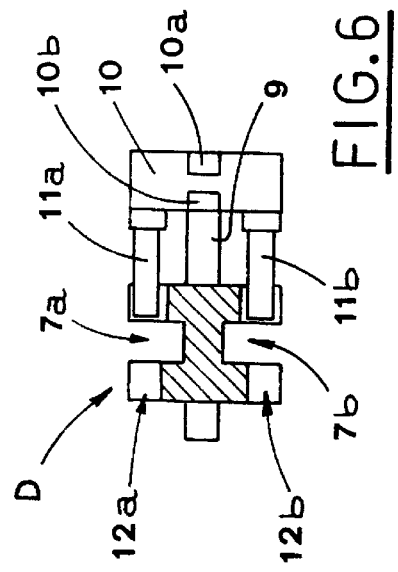

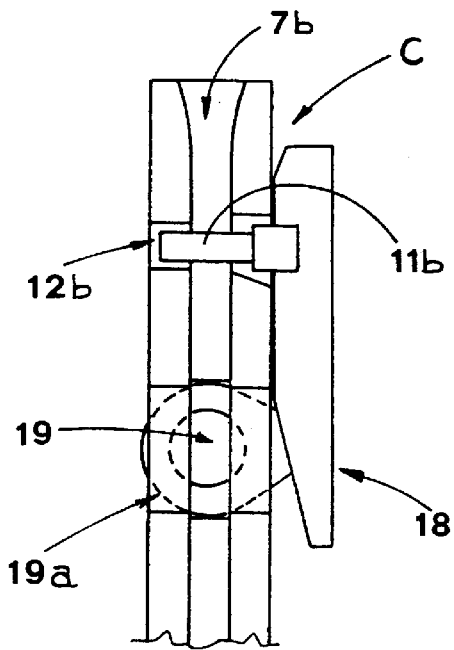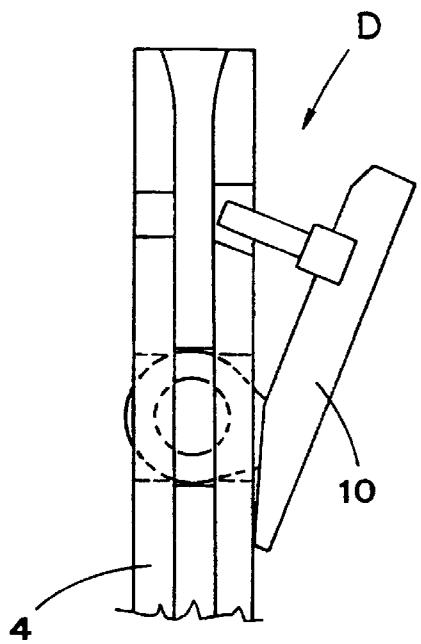
FIG.9a
FIG.9b
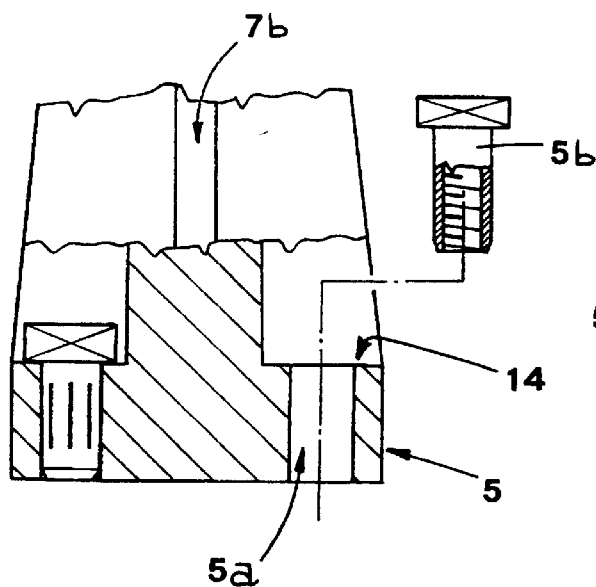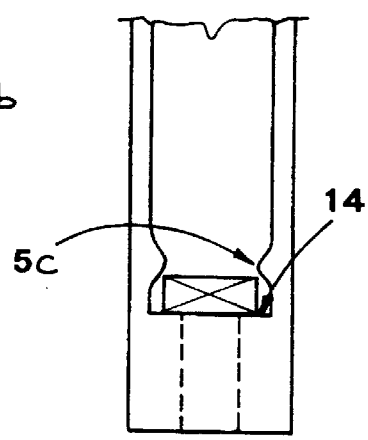
FIG.10
FIG.11

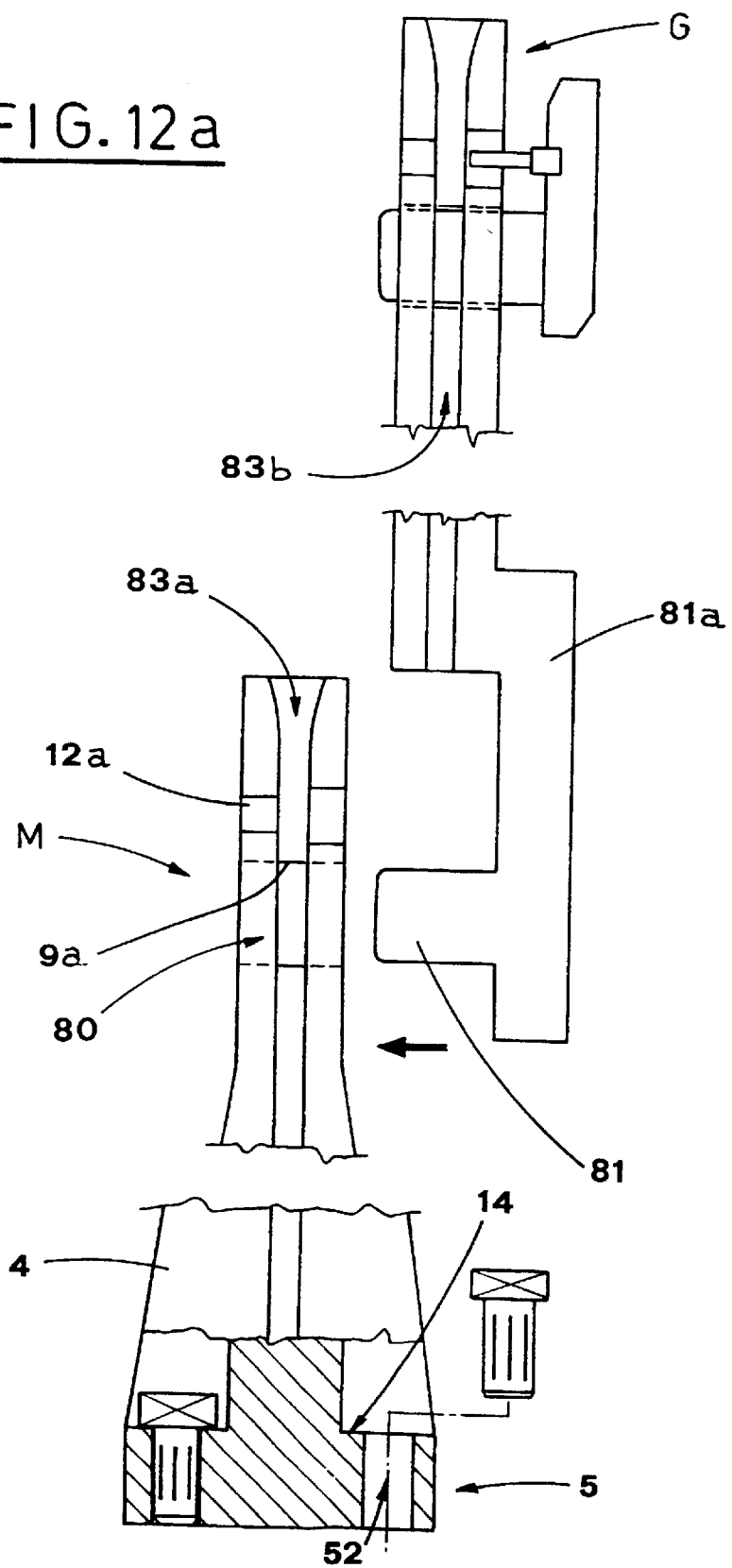

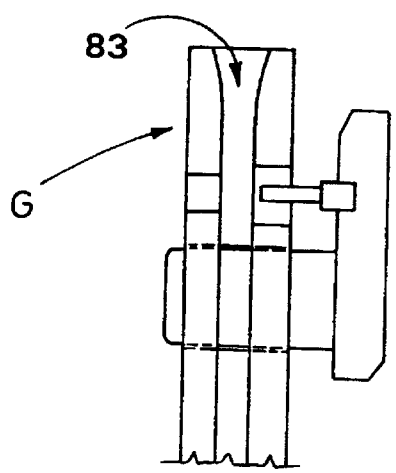
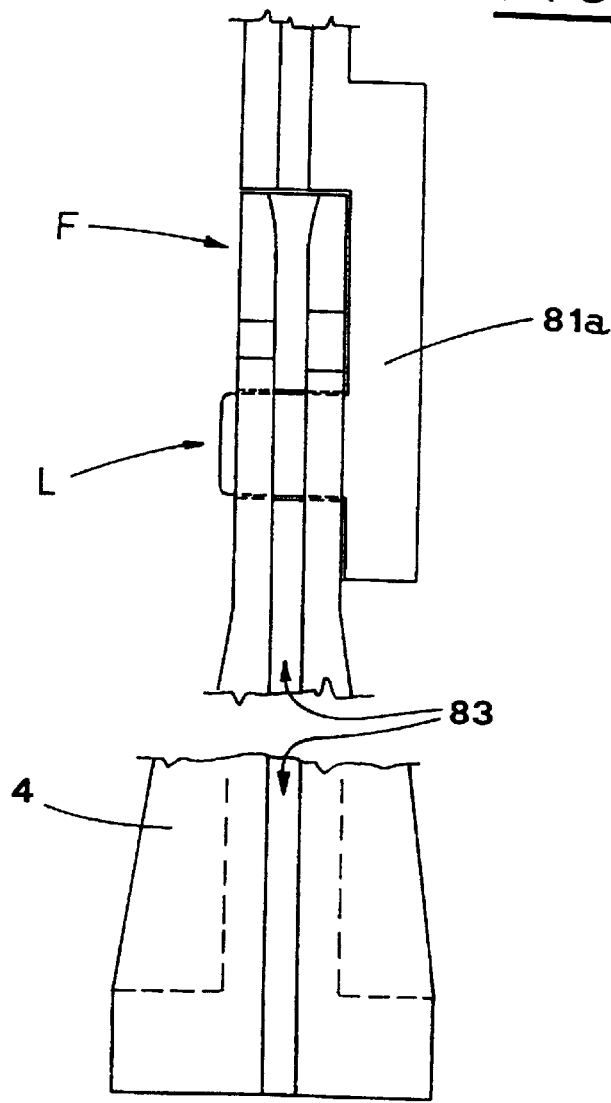
FIG. 12b

SUPPORT DEVICE FOR BOARDS, IN PARTICULAR FOR PRINTED CIRCUIT BOARDS

BACKGROUND OF THE INVENTION

The present invention relates to production of hardware components, in particular of printed circuit boards supports.

DESCRIPTION OF THE PRIOR ART

As it is known, additional boards of various types (e.g. audio, video, etc.) are usually connected to the mother board of a personal computer in order to add devices or to implement them.

The mother board is connected to each additional board by suitably prepared connectors, e.g. a socket connector, and the additional boards are held in place by properly shaped support devices.

As seen from FIGS. from 1 to 3, the support devices usually include a carrier oblong structure 90, generally made of plastic material, featuring a base 91, that can be removably fastened to the frame structure.

Two longitudinal grooves 92a, 92b, facing opposite directions, are made along the carrier structure 90 for guiding additional boards.

The top 94 of the carrier structure 90 is provided with a locking group 95, which removably locks the boards after they have been inserted in the groove.

The board locking group 95 slides perpendicularly with respect to the carrier structure 90 between a locking position A and release position B.

The board locking group 95 usually includes a control push button 96 integral with a bar 97 which passes through a crosswise hole 97a made in the carrier structure 90 and passing between the grooves 92.

The end of the bar 97 opposite to the control push button 96 is fastened to a stop plate 98, concentric therewith, whose sides are provided with two pins 99a, 99b, coplanar and parallel to the bar 97.

Each pin 99a, 99b slides in a corresponding transversal seat 80a, 80b which passes across a relative groove 92a, 92b and whose length covers the whole groove, when the slide 95 is in the locking position A.

Likewise, when the slide 95 is in the release position B, the length of the bar 97 must be enough to guarantee that the pins 99a, 99b are totally clear of the grooves 92a, 92b.

Generally, the grooves 92 co-operate with pairs of wings 71, which are arranged side by side and whose task is to improve and stabilise the boards locking when the slide 95 is in the locking position.

This is necessary, since the standard thickness of the boards, according to the norms, is 1.6 mm, with a margin of +10%.

Longitudinal shifting of the board inside the grooves 92 is prevented by introduction of the pins 99a, 99b of the slide 95 (in the locking position A) into a related holes made in the board lateral edge.

Each pin 99, co-operating with a similar fastening device, stabilises and locks one board, sliding in the corresponding groove 92.

The carrier structure 90 is usually fastened to a frame by threaded bushings made in the base 91 of the carrier structure 90 and set dipped therein.

Sometimes the fastening is realised by simple through holes made in the base.

The most important disadvantage of the described support devices derives from their extreme fragility in the area of the support structure interacting with the locking group.

In fact, in this area, the support structure has small section, features the seat, in which the bar slides, and is further weakened by the coplanar seats, in which the pins slide.

Frequent movements of the locking group can cause a crack in the support structure near the critic area and substitution of the whole support may be necessary.

This leads to a considerable increase of costs due to a specialised intervention and its duration.

Moreover, the production of the traditional device is very expensive, as it requires elaborate expensive moulds and particularly delicate processing steps, mainly because of the metallic inserts used in a structure made predominantly of plastic material.

Also important is the consideration of undesired oscillations of the slide with respect to the central bar, when the slide takes both the locking and in the release positions.

These oscillations increase the probability of the device cracking in the area of the board fastening hole, which leads to the board being non longer firm with respect to the mother board and cause the danger of disconnection therebetween.

SUMMARY OF THE INVENTION

The proposed support device for printed circuit boards has been evolved with the object to avoid the above mentioned drawbacks by manufacturing a particularly strong and reliable structure, which can prevent occurring of crack.

Another object of the present invention is to propose a device which optimises the connection with the boards guaranteeing that the boards are locked at the best and firm, thus avoiding disconnection from the mother board.

A further object of the present invention is to propose a support device obtained by a simple technical solution, which drastically reduces the production costs, maintaining the device functionality and reliability.

The above mentioned objects are obtained, in accordance with the claims, by means of a support device for boards, in particular for printed circuits, including:

a support structure longitudinally equipped with at least one board guiding groove and with a base area detachably fastened to a suitable carrier;

at least one transversal cutting made across said groove;

a locking group associated to said support structure and taking two positions, namely a locking position, to detachably lock the boards, and a release position, to free the boards;

a guiding element for connecting said locking group to said support structure, said guiding element moving inside a relative guiding seat and having an axis transversal with respect to said guiding groove;

a plate associated to said locking group and provided with at least one locking element set in engagement with said transversal cutting when said locking group is in said locking position, for locking a board inserted into said grooves, and released from said transversal cutting to let said board free when said locking group is in said release position;

with the locking element positioned at a different level than the guiding element.

BRIEF DESCRIPTION OF THE DRAWINGS

The characteristic features of the invention will be pointed out in the following description of some, not exclusive, embodiments, with reference to the enclosed drawings, in which:

FIG. 1 is a schematic lateral view of a support device according to prior art;

FIGS. 2a, 2b are enlarged views taken along the line II—II of FIG. 1 in two particularly significant working steps;

FIG. 3 is a section view taken along the line III—III of FIG. 2b;

FIG. 4 is a schematic lateral view of the upper part of the claimed support device;

FIG. 5 is schematic front view, seen from the direction indicated by the arrow H, of the device of FIG. 4;

FIG. 6 is a section view taken along the line VI—VI of FIG. 4;

FIG. 7 is a section view taken along the line VII—VII of FIG. 4;

FIG. 8 is a schematic enlarged view of the particular K of FIG. 4;

FIGS. 9a, 9b are lateral views of two significant working conditions of the proposed device obtained according to another embodiment;

FIG. 10 a schematic, partially section view of a way of fastening the claimed device;

FIG. 11 is a view of another embodiment of fastening of the claimed device;

FIGS. 12a, 12b are lateral views of two significant working conditions according to another embodiment.

DESCRIPTION OF THE PREFERRED EMBODIMENTS

With reference to the enclosed drawings, the reference numeral 1 generally designates the proposed support for boards, basically including a substantially oblong support structure 4 featuring a top 6 and a base 5.

The base 5 engages with a suitable carrier frame, not shown.

The support structure 4 is made e.g. of plastic material and has two longitudinal grooves, a first groove 7a and second groove 7b, facing opposite directions, for guiding the boards.

The top 6 of the support structure 4 has a locking group 8, e.g. a slide, whose task is to removably lock the boards after they have been inserted.

The slide 8, moving crosswise to the support structure 4 between a locking position C and a release position D, includes a guide member 9, e.g. a metal square shaped bolt.

A plate 10 is symmetrically connected to one end of the bolt 9 and goes in abutment on the support structure, when the slide is in the locking position C.

The plate 10 is provided with locking means, first 11a and second 11b, e.g. pins, which are arranged symmetrically with respect to a plan passing through the bolt 9. The pins are not coplanar with the bolt 9.

The bolt 9 slides (with clearance) inside a relative guiding seat 9a, of a complementary section, while the pins, first 11a and second 11b, engage (with clearance) corresponding transversal cuttings, first 12a and second 12b, made crosswise to the respective grooves, first 7a and second 7b.

Retention means 13, e.g. one semi-sphere prominences, are provided at the side of the bolt 9 to fix the positions that the slide 8 can assume.

It is to be pointed out that the bolt 9, the plate 10 and the locking means, first 11a and second 11b can be advantageously made in only one body.

The plate 10 features also, in its upper part, longitudinal notches 10a, 10b that face opposite directions.

The grooves, first 7a and second 7b, are laterally equipped with protuberances 37, with e.g. semi-spherical shape, staggered with respect to one another and arranged in such a way that the distance between the opposite protuberances is 1.6 mm, i.e. equal to the standard thickness of the boards to be introduced therein.

The distance between each protuberance 37 and the opposite surface is 1.72 mm, i.e. equal to the maximum nominal thickness of the board, according to unified norms.

The base 5 of the support structure 4 has at least two bores 5a, made parallel to, and at both sides of the extension of the grooves. The bores 5a lead to respective recesses delimited at bottom by relative abutments 14 (FIG. 10).

The bores 5a co-operate with relative fastening means 5b, e.g. threaded, preferably square headed bushes, which, under the action of related suitable screws, detachably fasten the base 5 to a carrier.

The stability of the connection between the fastening means 5b and relative bores 5a can be improved by corresponding stabilising means 5c, e.g. semi-sphere juts, situated in the region of the abutments 14 (FIG. 11).

Otherwise, the outer surfaces of the threaded bushes 5b can be knurled, so as to improve the stability of their coupling to the bores 5a.

The two ways of fixing the coupling can be used together. With two board support devices 1 situated side by side and suitably distanced, and with the relative slides 8 in the release position D, the board is inserted in such a way that its edges slide into the corresponding grooves, e.g. first 7a and second 7b, of two support devices 1 situated side by side.

When the board goes in abutment against the frame structure to which the support device is fastened, the locking holes made in the board lateral edge are aligned and face corresponding transversal cuttings, first 12a and second 12b made crosswise to the grooves, first 7a and second 7b.

Meanwhile, the board cannot be withdrawn because the protuberances made in the grooves act on the board lateral edges.

Now, the slides 8 can be moved from the respective release positions D to the locking positions C, i.e. until the plates 10 abut against the corresponding support structures 4, by acting with suitably tools, e.g. screwdriver, preferably on the notches 10a, 10b of the plates 10.

Thus, the pins, first 11a and second 11b, crosses completely the transversal cuttings, first 12a and second 12b, passing also through the corresponding board locking bores.

Thus, the board remains locked between the guide grooves, the frame structure and the slides and can be interconnected to the adjacent mother board by suitable connectors.

If the board is to be removed, e.g. for maintenance, it is enough to act on the notches 10a, 10b of each slide 8 to shift the slides up to their release positions D, so as to disengage the corresponding pins, first 11a and second 11b from the board locking bores and withdraw the board from the grooves, first 7a and second 7b.

According to another embodiment, the device is equipped with a locking group 18 including a rotary guide element 19 which is not shifted as described for the embodiment previously referred to.

In this new case, the plate 10 which supports the pins, first 11a and second 11b, is mounted on a pivot 19 introduced with interference fit into a relative seat 19a attached to the plate. The plate 10 can be rotated to take either a locking position C, with the first and second pins 11*a*, 11*b* introduced in the corresponding transversal cuttings, or a release position D with the first and second pins 12*a*, 12*b* extracted from the cuttings.

According to a further embodiment, the support device 1 can be adapted to different sizes of the boards it has to support.

To obtain this advantage, the support structure 4 is made up of two portions, namely a lower portion F and an upper portion G (FIGS. 12*a*, 12*b*).

The lower portion F has a first longitudinal section 83*a* with a board guide groove 83, and features at its bottom end the above mentioned base 5. At its upper end, the lower portion F features a first coupling element 80, formed by e.g. a seat made crosswise to the relative board guide groove 83.

The upper portion G has a second longitudinal section 83*b* also with a board guide groove 83, and features forms the first transversal cutting 12*a* and the guiding seat 9*a* and is equipped with a second coupling element 81, e.g. a plate, which co-operates with the first coupling element or seat 80.

The upper portion G can be equipped with a translating locking group 8 or slide (the same as the one shown in FIGS. from 4 to 7) or with a rotating locking group 18 (the same as the one shown in FIGS. 9*a*, 9*b*).

The upper portion G, usually in condition M, i.e. disengaged from the lower portion F as in FIG. 12*a*, can be set in engagement condition L in which it is connected to the lower portion F, as it appears from FIG. 12*b*. The engagement condition is obtained by the introduction of the protrusion 81 into the seat 80, so that the corresponding sections, first 83*a* and second 83*b*, of the groove 83 are aligned.

The plate 81 is carried by an extension 81*a*, advantageously square shaped, which is made in such a way that, in the condition L, it goes in abutment against the lower portion F.

When the support structure 4 is made of two portions, the lower F and the upper G, allows to support printed circuit boards with bigger dimension.

The plate 81 and the extension 81*a* must be dimensioned, so that the first section 83*a* and the second section 83*b* of the board guide groove 83 can be aligned in the engaged condition L, so as to create a continuous guide for the boards to be supported.

In all the described cases, with the guiding element 9 formed by a plate sliding in a seat 9*a*, or by a pivot 19 rotating in a seat 19*a*, the locking group 8,18 is particularly stress resistant and therefore, reliable for a longer time.

Moreover, the guiding elements manufactured in this way stabilise the operation of the locking group 8,18 during the transition from the release position D to the locking position C, thus preventing oscillation of the tightening means and cracking of the fastening holes made in the boards lateral edges.

This way, it is possible to avoid dangerous cracking in the area of the support structure 4 co-operating with the locking group 8,18, which would cause considerable cost increase due to lacking of board operation and maintenance costs.

Longitudinal notches made in the upper part of the plate allows to handle the locking group in a more efficient way, usually with screwdrivers or suitable tools, in areas which are not easily accessible using hands.

This allows to realise designs with higher number of boards in the same area, with respect to traditional support systems.

The proposed technical solution is advantageous for the manufacturers who must reduce space and dimensions.

The uniform distribution of the semi-sphere protuberances in the grooves, first 7*a* and second 7*b*, guarantees best locking and a correct positioning of the board even before the locking group is moved from the release position D to the locking position C, thus guaranteeing the alignment of the boards fastening holes and the transversal cuttings, first 12*a* and second 12*b*, inside which the relative locking means slide.

The fact that the locking group 8,18 is made in one body of plastic material facilitates the production steps, considerably reducing the costs and guaranteeing best structural reliability.

The support structure 4 of the base 5 is fastened to a suitable carrier by introduction, after the moulding step, of the threaded, preferably square headed bushes 5*b* into the relative bores 5*a*, which allows to considerably reduce the production costs, without changing the fastening functionality.

The coupling of the threaded bushes 5*b* with the relative bores 5*a* is advantageously stabilised by outer ribs of the bushes and/or by stabilising means 5*c*, which are situated near the abutments 14 and abut against the head of the bush 5*b*.

The above mentioned advantages are obtained by a simple, extremely reliable and particularly functional technical solution.

It is also to pointed out that the proposed device includes a limited number of components, which are simple to be manufactured, which reduces production costs.

It is understood that what above has been described as a mere, non limitative example, therefore possible constructive variants of the proposed device remain within the protective scope of the present technical solution, ad described above and claimed in the following.

What is claimed is:

1. A support device for boards, in particular for printed circuits, including:

a support structure longitudinally equipped with at least one board guiding groove and with a base area detachably fastened to a suitable carrier;

at least one transversal cutting made across said groove;

a locking group associated to said support structure and taking two positions, namely a locking position, to detachably lock the boards, and a release position, to free the boards;

a guiding element for connecting said locking group to said support structure, said guiding element moving inside a relative guiding seat and having an axis transversal with respect to said guiding groove;

a plate associated to said locking group and provided with at least one locking element set in engagement with said transversal cutting when said locking group is in said locking position, for locking a board inserted into said grooves, and released from said transversal cutting to let said board free when said locking group is in said release position;

said support device being characterised in that said locking element (11*a*) is positioned at a different level than the guiding element (9,19).

2. A device, according to claim 1, including stabilising means (13), situated beside said guiding element (9,19), for stabilising said release position (C) and locking position (D), assumed by the locking element (11*a*).

3. A device, according to claim 2, wherein said guiding element (9) includes a bolt with polygonal section which slides inside a corresponding seat (9a) and in that said stabilising means (13) include a semi-sphere prominence, integral with said bolt (9).

4. A device, according to claim 1, wherein said guiding element (19) includes a pivot moving inside a corresponding seat (19a).

5. A device, according to claim 1, wherein said plate (10) has made therein, a pair of longitudinal notches (10a, 10b), facing opposite directions and interacting with suitable tools for moving said locking group (8,18).

6. A device, according to claim 1, wherein said base (5) is equipped with at least two bores (5a), parallel to said groove and leading to recesses delimited at bottom by relative abutments (14), and in that it includes fastening means (5b) which are introduced inside said bores (5a), so as to detachably fasten said base (5) to said carrier.

7. A device, according to claim 6, wherein said fastening means (5b) have external ribs to improve the stability of their coupling to the corresponding bores (5a).

8. A device, according to claim 6, including corresponding fixing means (5c) situated near the abutments (14) and allowing snap insertion of the fastening means (5b) into the relative bores (5a).

9. A device, according to claim 6, wherein said fastening means (5b) include threaded bushes, whose heads are polygonal or have a shape which contrasts the rotation with respect to the corresponding bores (5a).

10. A device, according to claim 8, wherein said fixing means (5c) include juts which go in abutment against the upper head of said fastening means (5b), when the latter are completely introduced into the corresponding bores (5a).

11. A device, according to claim 1, wherein said locking element (11) include a pin.

12. A device, according to claim 1, wherein said locking group (8,18) is made in one integral body.

13. A device, according to claim 1, including at least one pair of protuberances (37), which face each other and are staggered with respect to one another, and are situated along the walls of said groove (7a).

14. A device, according to claim 13, wherein the distance between the opposite protuberances (37) is 1.6 mm and the distance between each protuberance (37) and the opposite surface is 1.72 mm.

15. A device, according to claim 1, wherein said support structure (4) is made in one body.

16. A device, according to claim 1, wherein said support structure (4) includes:

a lower portion (F) featuring at one end said base (5);

a first coupling element (80) made at the other end of said lower portion (F);

a first longitudinal section (83a) of said board guide groove (83) made along said lower portion (F);

an upper portion (G) co-operating with said locking group (8,18) and featuring a second longitudinal section (83b) of said board guide groove (83), said transversal cutting (12a), and said guiding seat (9a);

a second coupling element (81), which co-operates with said first coupling element (80);

with said upper portion (G) movable from a disengaged condition (M), in which it is disengaged from the lower portion F, to an engaged condition (L), defined by the removable joining of said first coupling element (80) and second coupling element (81), so that the corresponding sections, first (83a) and second (83b) of the groove (83) are aligned.

17. A device, according to claim 1, wherein said first coupling element (80) includes a through seat having axis crosswise to the relative groove, and said second coupling element (81) includes a protrusion, whose section is complementary to said seat (80).

18. A device, according to claim 1, wherein said portion (D) includes an extension (81a) which carries said protrusion (81) and whose shape allows it to go in abutment against said lower portion (F), when said portion (G) is in the engaged condition (L).

* * * * *